US012799587B2

(12) United States Patent
Nishiura et al.

(10) Patent No.: US 12,799,587 B2
(45) Date of Patent: Nov. 17, 2026

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: KOKUSAI ELECTRIC CORPORATION, Tokyo (JP)

(72) Inventors: Susumu Nishiura, Toyama (JP); Hideto Shimizu, Toyama (JP); Kaori Inoshima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 914 days.

(21) Appl. No.: 17/735,543

(22) Filed: May 3, 2022

(65) Prior Publication Data

US 2022/0262630 A1 Aug. 18, 2022

Related U.S. Application Data

(63) Continuation of application No. PCT/JP2020/045698, filed on Dec. 8, 2020.

(30) Foreign Application Priority Data

Dec. 9, 2019 (JP) ................................. 2019-222235

(51) Int. Cl.
*H10P 14/24* (2026.01)
*C23C 16/44* (2006.01)
(Continued)

(52) U.S. Cl.
CPC .......... *C23C 16/4405* (2013.01); *H10P 14/24* (2026.01); *H10P 14/3411* (2026.01);
(Continued)

(58) Field of Classification Search
CPC ......... H01L 21/02057; H01L 21/02263; H01L 21/0262; C23C 16/4405
(Continued)

(56) References Cited

U.S. PATENT DOCUMENTS 5,587,014 A 12/1996 Iyechika et al.
5,755,886 A * 5/1998 Wang ................ H01L 21/31604 118/725
(Continued)

FOREIGN PATENT DOCUMENTS

CN 1958878 B 4/2012
JP 08-213326 A 8/1996
(Continued)

OTHER PUBLICATIONS

Taiwan Office Action issued on Mar. 2, 2022 for Taiwan Patent Application No. 109143194.
(Continued)

*Primary Examiner* — Trang Q Tran
(74) *Attorney, Agent, or Firm* — Volpe Koenig

(57) ABSTRACT

According to one aspect of a technique the present disclosure, there is provided a method of manufacturing a semiconductor device, including: (a) processing a substrate accommodated in a process chamber by supplying a process gas to the substrate; and (b) removing deposits adhering to a structure in the process chamber by supplying a cleaning gas to the process chamber, wherein a period T2 from a completion of (b) to a start of an $(n+1)^{th}$ execution of (a) is set to be shorter than a period T1 from a completion of an $n^{th}$ execution of (a) to a start of (b), and wherein n is an integer equal to or greater than 1.

13 Claims, 5 Drawing Sheets

(51) Int. Cl.
*H10P 14/20* (2026.01)
*H10P 14/60* (2026.01)
*H10P 14/692* (2026.01)
*H10P 70/00* (2026.01)

(52) U.S. Cl.
CPC ...... *H10P 14/6328* (2026.01); *H10P 14/6922* (2026.01); *H10P 70/20* (2026.01)

(58) Field of Classification Search
USPC ........................................................ 438/106
See application file for complete search history.

(56) References Cited

U.S. PATENT DOCUMENTS

| | | | | |
|---|---|---|---|---|
| 2007/0093075 | A1 | 4/2007 | Noro et al. | |
| 2009/0229634 | A1 | 9/2009 | Nomura et al. | |
| 2011/0082581 | A1 | 4/2011 | Ozaki et al. | |
| 2013/0189840 | A1* | 7/2013 | Fu ..................... | H01L 21/76814 438/680 |
| 2015/0232986 | A1* | 8/2015 | Kameda ............ | C23C 16/45546 438/758 |
| 2018/0204732 | A1* | 7/2018 | Kamakura ............ | H01L 23/532 |
| 2018/0286662 | A1* | 10/2018 | Nagatomi ............. | C23C 16/405 |
| 2020/0216961 | A1 | 7/2020 | Nomura et al. | |

FOREIGN PATENT DOCUMENTS

| | | | |
|---|---|---|---|
| JP | 2005-079123 | A | 3/2005 |
| JP | 2006-313934 | A | 11/2006 |
| JP | 2009-231809 | A | 10/2009 |
| JP | 2011-243677 | A | 12/2011 |
| JP | 2013-187366 | A | 9/2013 |
| JP | 2015-162638 | A | 9/2015 |
| TW | I461869 | B | 11/2014 |
| WO | 2019/058597 | A1 | 3/2019 |

OTHER PUBLICATIONS

Japanese Office Action issued on Jun. 9, 2023 for Japanese Patent Application No. 2021-563974.

Extended European Search Report issued on Dec. 13, 2023 for European Patent Application No. 20899233.9.

State Intellectual Property Office Action issued on Aug. 1, 2025 for China Patent Application No. 202080072930.1.

* cited by examiner

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This application is a bypass continuation application of PCT International Application No. PCT/JP2020/045698, filed on Dec. 8, 2020, in the WIPO, the international application being based upon and claiming the benefit of priority from Japanese Patent Application No. 2019-222235, filed on Dec. 9, 2019, in the Japanese Patent Office, the entire contents of which are hereby incorporated by reference.

BACKGROUND

1. Field

The present disclosure relates to a method of manufacturing a semiconductor device, a substrate processing apparatus and a non-transitory computer-readable recording medium.

2. Related Art

As a part of a manufacturing process of a semiconductor device, a substrate processing of processing a substrate by supplying a process gas to the substrate arranged in a process chamber may be performed. According to some related arts, when deposits adhere to a structure such as a component in the process chamber by performing the substrate processing a plurality of times, a cleaning process may be performed at a predetermined timing.

SUMMARY

According to the present disclosure, there is provided a technique capable of uniformizing a quality of a substrate processing between a plurality of executions of the substrate processing.

According to one or more embodiments of the present disclosure, there is provided a technique related to a method of manufacturing a semiconductor device, including: (a) processing a substrate accommodated in a process chamber by supplying a process gas to the substrate; and (b) removing deposits adhering to a structure in the process chamber by supplying a cleaning gas to the process chamber, wherein a period T2 from a completion of (b) to a start of an $(n+1)^{th}$ execution of (a) is set to be shorter than a period T1 from a completion of an $n^{th}$ execution of (a) to a start of (b), and wherein n is an integer equal to or greater than 1.

DETAILED DESCRIPTION

Embodiments of Present Disclosure

Hereinafter, one or more embodiments (also simply referred to as "embodiments") according to the technique of the present disclosure will be described mainly with reference to FIGS. 1 through 5A.

(1) Configuration of Substrate Processing Apparatus

Figure 1:
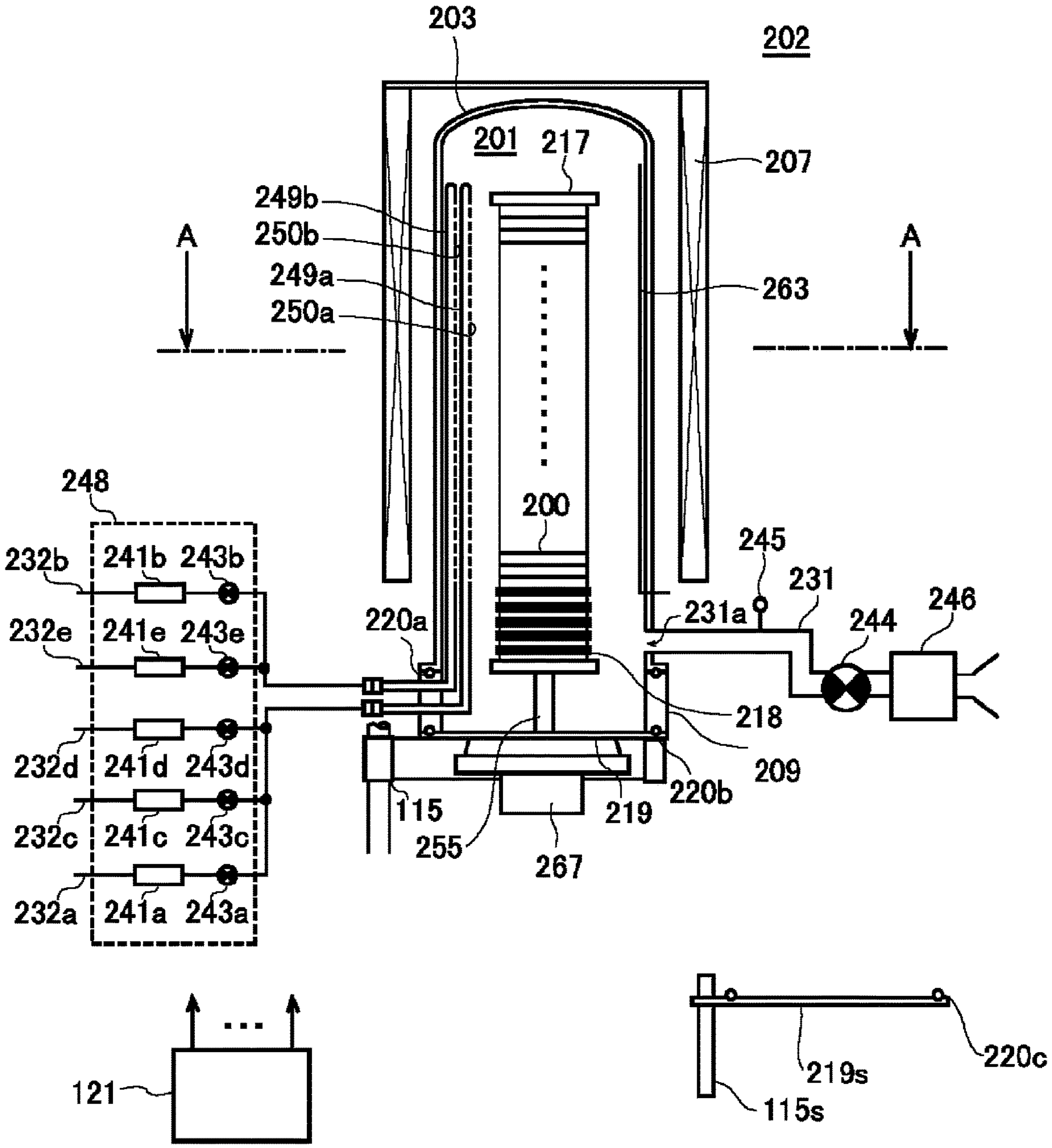
FIG. 1 is a diagram schematically illustrating a vertical cross-section of a vertical type process furnace of a substrate processing apparatus preferably used in one or more embodiments of the present disclosure.

As shown in FIG. 1, a substrate processing apparatus according to the present embodiments includes a process furnace 202. The process furnace 202 is provided with a heater 207 serving as a heating structure (or a temperature regulator). The heater 207 is of a cylindrical shape, and is vertically installed while being supported by a support plate (not shown). The heater 207 also functions as an activator (also referred to as an "exciter") capable of activating (or exciting) a gas such as a process gas by a heat.

A reaction tube 203 is provided in an inner side of the heater 207 to be aligned in a manner concentric with the heater 207. For example, the reaction tube 203 is made of a heat resistant material such as quartz ($SiO_2$) and silicon carbide (SiC). The reaction tube 203 is of a cylindrical shape with a closed upper end and an open lower end. A manifold 209 is provided under the reaction tube 203 to be aligned in a manner concentric with the reaction tube 203. For example, the manifold 209 is made of a metal material such as stainless steel (SUS). The manifold 209 is of a cylindrical shape with open upper and lower ends. An upper end portion of the manifold 209 is engaged with a lower end portion of the reaction tube 203 so as to support the reaction tube 203. An O-ring 220*a* serving as a seal is provided between the manifold 209 and the reaction tube 203. Similar to the heater 207, the reaction tube 203 is installed vertically. A process vessel (also referred to as a "reaction vessel") is constituted mainly by the reaction tube 203 and the manifold 209. A process chamber 201 is provided in a hollow cylindrical portion of the process vessel. The process chamber 201 is configured to accommodate a plurality of wafers including a wafer 200 serving as a substrate. Hereinafter, the plurality of wafers including the wafer 200 may also be simply referred to as "wafers 200". The wafers 200 are processed in the process chamber 201.

Nozzles 249*a* and 249*b* are provided in the process chamber 201 so as to penetrate a side wall of the manifold 209. The nozzles 249*a* and 249*b* serve as a first supplier (which is a first supply structure) and a second supplier (which is a second supply structure), respectively. The nozzles 249*a* and 249*b* may also be referred to as a first nozzle and a second nozzle, respectively. For example, each of the nozzles 249*a* and 249*b* is made of a heat resistant non-metal material such as quartz and SiC. Each of the nozzles 249a and 249b is configured as a shared nozzle through which a plurality of kinds of gas are supplied.

A gas supply pipe 232a serving as a first pipe and a gas supply pipe 232b serving as a second pipe are connected to the nozzles 249a and 249b, respectively. Each of the gas supply pipes 232a and 232b is configured as a shared pipe through which the plurality of kinds of gas are supplied. Mass flow controllers (also simply referred to as "MFCs") 241a and 241b serving as flow rate controllers (flow rate control structures) and valves 243a and 243b serving as opening/closing valves are sequentially installed at the gas supply pipes 232a and 232b, respectively, in this order from upstream sides to downstream sides of the gas supply pipes 232a and 232b in a gas flow direction. Gas supply pipes 232c and 232d are connected to the gas supply pipe 232a at a downstream side of the valve 243a of the gas supply pipe 232a. MFCs 241c and 241d and valves 243c and 243d are sequentially installed at the gas supply pipes 232c and 232d, respectively, in this order from upstream sides to downstream sides of the gas supply pipes 232c and 232d in the gas flow direction. A gas supply pipe 232e is connected to the gas supply pipe 232b at a downstream side of the valve 243b of the gas supply pipe 232b. An MFC 241e and a valve 243e are sequentially installed at the gas supply pipe 232e in this order from an upstream side to a downstream side of the gas supply pipe 232e in the gas flow direction. For example, each of the gas supply pipes 232a through 232e is made of a metal material such as SUS.

Figure 2:
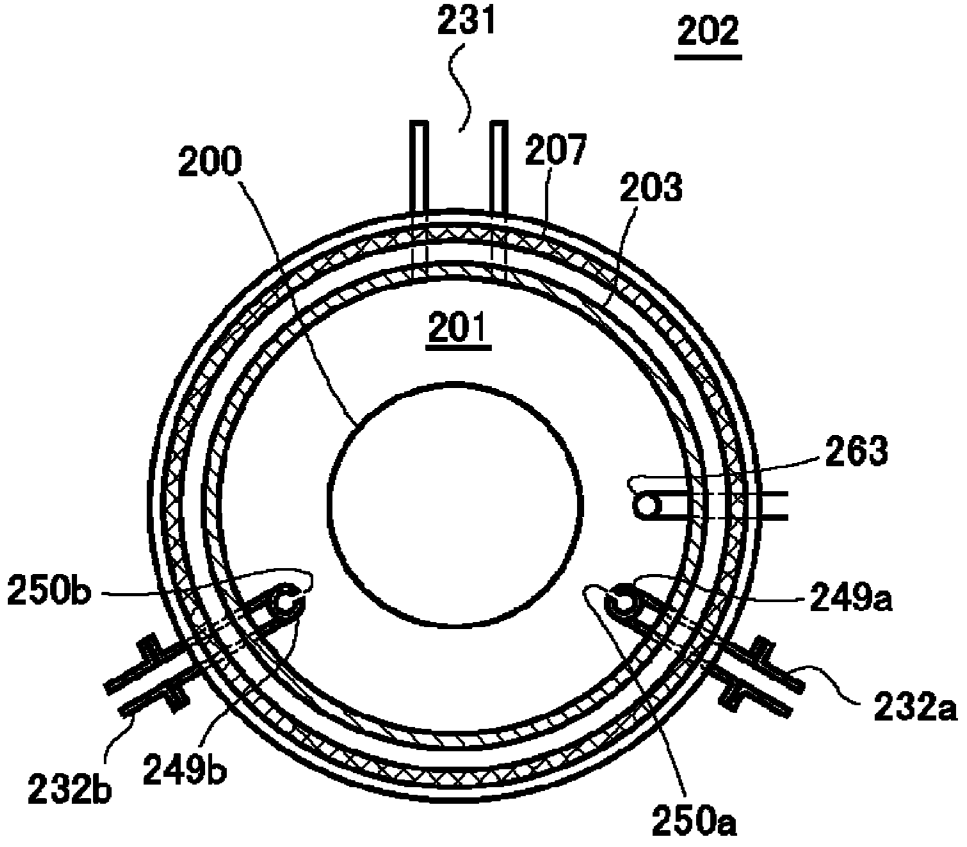
FIG. 2 is a diagram schematically illustrating a horizontal cross-section taken along the line A-A, shown in FIG. 1, of the vertical type process furnace of the substrate processing apparatus preferably used in the embodiments of the present disclosure.

As shown in FIG. 2, each of the nozzles 249a and 249b is installed in an annular space provided between an inner wall of the reaction tube 203 and the wafers 200 when viewed from above, and extends upward from a lower portion toward an upper portion of the reaction tube 203 along the inner wall of the reaction tube 203 (that is, extends upward along a wafer arrangement direction of the wafers 200). That is, each of the nozzles 249a and 249b is installed in a region that is located beside and horizontally surrounds a wafer arrangement region in which the wafers 200 are arranged (stacked) to extend along the wafer arrangement region. A plurality of gas supply holes 250a and a plurality of gas supply holes 250b are provided at side surfaces of the nozzles 249a and 249b, respectively. Gases are supplied through the gas supply holes 250a and the gas supply holes 250b. The gas supply holes 250a and the gas supply holes 250b are open toward centers of the wafers 200, when viewed from above, and are configured such that the gases are supplied toward the wafers 200 through the gas supply holes 250a and the gas supply holes 250b. The gas supply holes 250a and the gas supply holes 250b are provided from the lower portion toward the upper portion of the reaction tube 203.

For example, as the process gas (also referred to as a "source gas"), a silane-based gas containing silicon (Si) serving as a main element constituting a film to be formed on the wafer 200 is supplied into the process chamber 201 through the gas supply pipe 232a provided with the MFC 241a and the valve 243a and the nozzle 249a. For example, the source gas refers to a source material in a gaseous state under a normal temperature and a normal pressure or a gas obtained by vaporizing a source material in a liquid state under the normal temperature and the normal pressure.

For example, as a cleaning gas, a fluorine-based gas is supplied into the process chamber 201 through the gas supply pipe 232b provided with the MFC 241b and the valve 243b and the nozzle 249b.

For example, as an additive gas, a nitrogen oxide-based gas is supplied into the process chamber 201 through the gas supply pipe 232c provided with the MFC 241c and the valve 243c, the gas supply pipe 232a and the nozzle 249a. The nitrogen oxide-based gas cannot perform a cleaning action by itself. However, the nitrogen oxide-based gas serves to improve the cleaning action of the fluorine-based gas (that is, the cleaning gas) by generating active species such as halogenated nitrosyl compounds when it reacts with the fluorine-based gas.

For example, as an inert gas, nitrogen ($N_2$) gas is supplied into the process chamber 201 through the gas supply pipes 232d and 232e provided with the MFCs 241d and 241e and the valves 243d and 243e, respectively, the gas supply pipes 232a and 232b and the nozzles 249a and 249b. For example, the $N_2$ gas acts as a purge gas, a carrier gas or a dilution gas.

A process gas supplier (which is a process gas supply structure or a process gas supply system) is constituted mainly by the gas supply pipe 232a, the MFC 241a and the valve 243a. The process gas supplier may also be referred to as a source gas supplier (which is a source gas supply structure or a source gas supply system). A cleaning gas supplier (which is a cleaning gas supply structure or a cleaning gas supply system) is constituted mainly by the gas supply pipe 232b, the MFC 241b and the valve 243b. An additive gas supplier (which is an additive gas supply structure or an additive gas supply system) is constituted mainly by the gas supply pipe 232c, the MFC 241c and the valve 243c. An inert gas supplier (which is an inert gas supply structure or an inert gas supply system) is constituted mainly by the gas supply pipes 232d and 232e, the MFCs 241d and 241e and the valves 243d and 243e.

Any one or an entirety of the gas suppliers described above may be embodied as an integrated gas supply system 248 in which the components such as the valves 243a through 243e and the MFCs 241a through 241e are integrated. The integrated gas supply system 248 is connected to the respective gas supply pipes 232a through 232e. An operation of the integrated gas supply system 248 to supply various gases to the gas supply pipes 232a through 232e, for example, operations such as an operation of opening and closing the valves 243a through 243e and an operation of adjusting flow rates of the gases through the MFCs 241a through 241e may be controlled by a controller 121 which will be described later. The integrated gas supply system 248 may be embodied as an integrated structure (integrated unit) of an all-in-one type or a divided type. The integrated gas supply system 248 may be attached to or detached from the components such as the gas supply pipes 232a through 232e on a basis of the integrated structure. Operations such as maintenance, replacement and addition of the integrated gas supply system 248 may be performed on the basis of the integrated structure.

An exhaust port 231a through which an inner atmosphere of the process chamber 201 is exhausted is provided at a lower side wall of the reaction tube 203. The exhaust port 231a may be provided so as to extend upward from the lower portion toward the upper portion of the reaction tube 203 along a side wall of the reaction tube 203 (that is, along the wafer arrangement region). An exhaust pipe 231 is connected to the exhaust port 231a. For example, the exhaust pipe 231 is made of a metal material such as SUS. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (pressure detection structure) to detect an inner pressure of the process chamber 201, and the APC valve 244 serves as a pressure regulator (pressure adjusting structure).

With the vacuum pump 246 in operation, the APC valve 244 may be opened or closed to vacuum-exhaust the process chamber 201 or stop the vacuum exhaust. With the vacuum pump 246 in operation, the inner pressure of the process chamber 201 may be adjusted by adjusting an opening degree of the APC valve 244 based on pressure information detected by the pressure sensor 245. An exhauster (which is an exhaust structure or an exhaust system) is constituted mainly by the exhaust pipe 231, the APC valve 244 and the pressure sensor 245. The exhauster may further include the vacuum pump 246.

A seal cap 219 serving as a furnace opening lid capable of airtightly sealing (or closing) a lower end opening of the manifold 209 is provided under the manifold 209. For example, the seal cap 219 is made of a metal material such as SUS, and is of a disk shape. An O-ring 220*b* serving as a seal is provided on an upper surface of the seal cap 219 so as to be in contact with the lower end of the manifold 209. A rotator 267 configured to rotate a boat 217 described later is provided under the seal cap 219. For example, a rotating shaft 255 of the rotator 267 is made of a metal material such as SUS. The rotating shaft 255 of the rotator 267 is connected to the boat 217 through the seal cap 219. As the rotator 267 rotates the boat 217, the wafers 200 accommodated in the boat 217 are rotated. The seal cap 219 is configured to be elevated or lowered in a vertical direction by a boat elevator 115 serving as an elevator provided outside the reaction tube 203. The boat elevator 115 serves as a transfer system (which is a transfer structure) that loads the boat 217 and the wafers 200 accommodated in the boat 217 into the process chamber 201 or unloads the boat 217 and the wafers 200 accommodated in the boat 217 out of the process chamber 201 by elevating or lowering the seal cap 219.

A shutter 219*s* serving as a furnace opening lid capable of airtightly sealing (or closing) the lower end opening of the manifold 209 is provided under the manifold 209. The shutter 219*s* is configured to close the lower end opening of the manifold 209 when the seal cap 219 is lowered and the boat 217 is unloaded out of the process chamber 201. For example, the shutter 219*s* is made of a metal material such as SUS, and is of a disk shape. An O-ring 220*c* serving as a seal is provided on an upper surface of the shutter 219*s* so as to be in contact with the lower end of the manifold 209. An opening and closing operation of the shutter 219*s* such as an elevation operation and a rotation operation is controlled by a shutter opener/closer (which is a shutter opening/closing structure) 115*s*.

The boat 217 serving as a substrate retainer is configured such that the wafers 200 (for example, 25 wafers to 200 wafers) are accommodated (or supported) in the vertical direction in the boat 217 while the wafers 200 are horizontally oriented with their centers aligned with one another with a predetermined interval therebetween in a multistage manner. For example, the boat 217 is made of a heat resistant material such as quartz and SiC. For example, a plurality of heat insulation plates 218 made of a heat resistant material such as quartz and SiC are provided below the boat 217 to be supported in a multistage manner.

A temperature sensor 263 serving as a temperature detector is installed in the reaction tube 203. A state of electric conduction to the heater 207 is adjusted based on temperature information detected by the temperature sensor 263 such that a desired temperature distribution of a temperature of the process chamber 201 can be obtained. The temperature sensor 263 is provided along the inner wall of the reaction tube 203.

Figure 3:
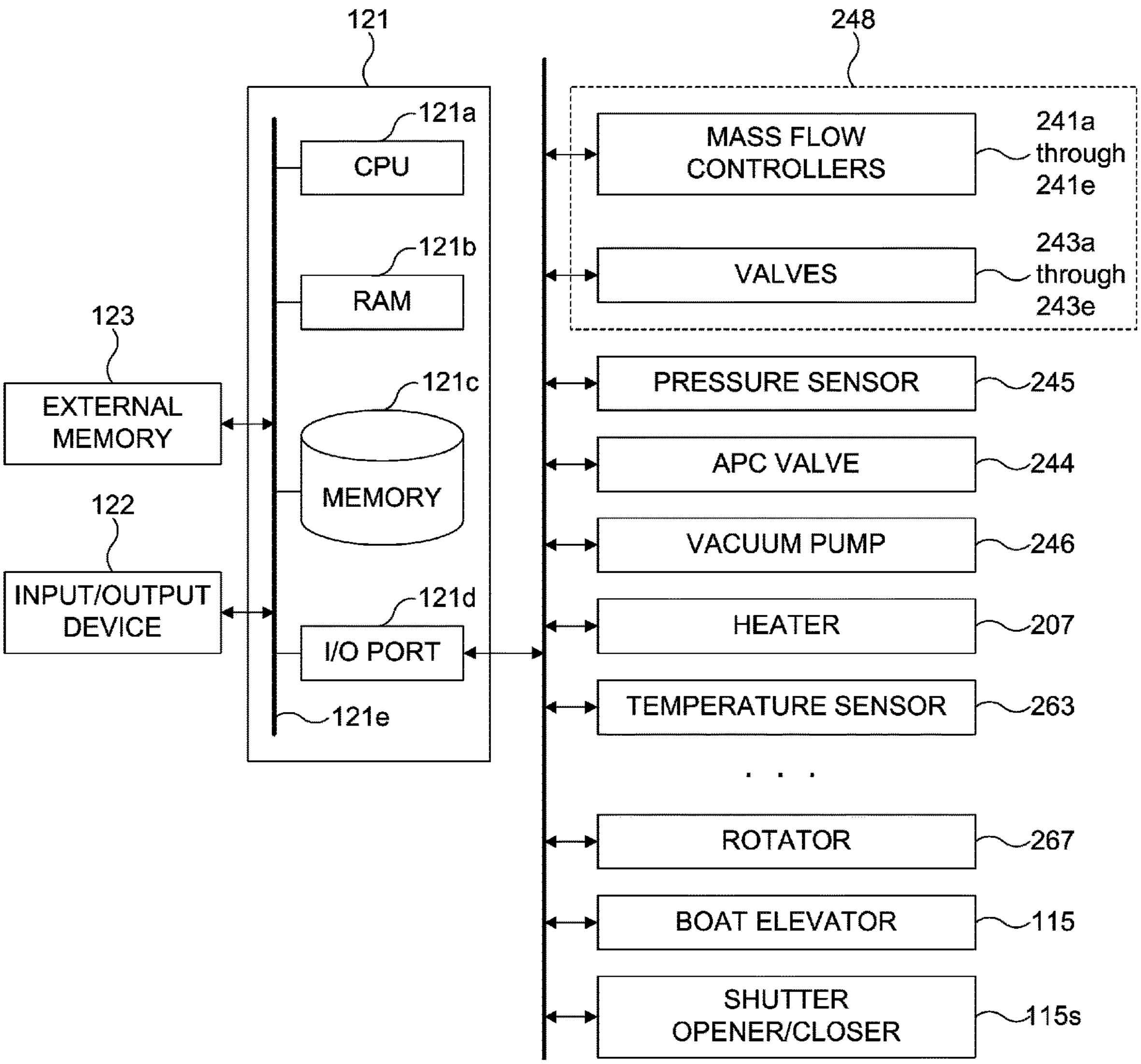
FIG. 3 is a block diagram schematically illustrating a configuration of a controller and related components of the substrate processing apparatus preferably used in the embodiments of the present disclosure.
Figure 4:
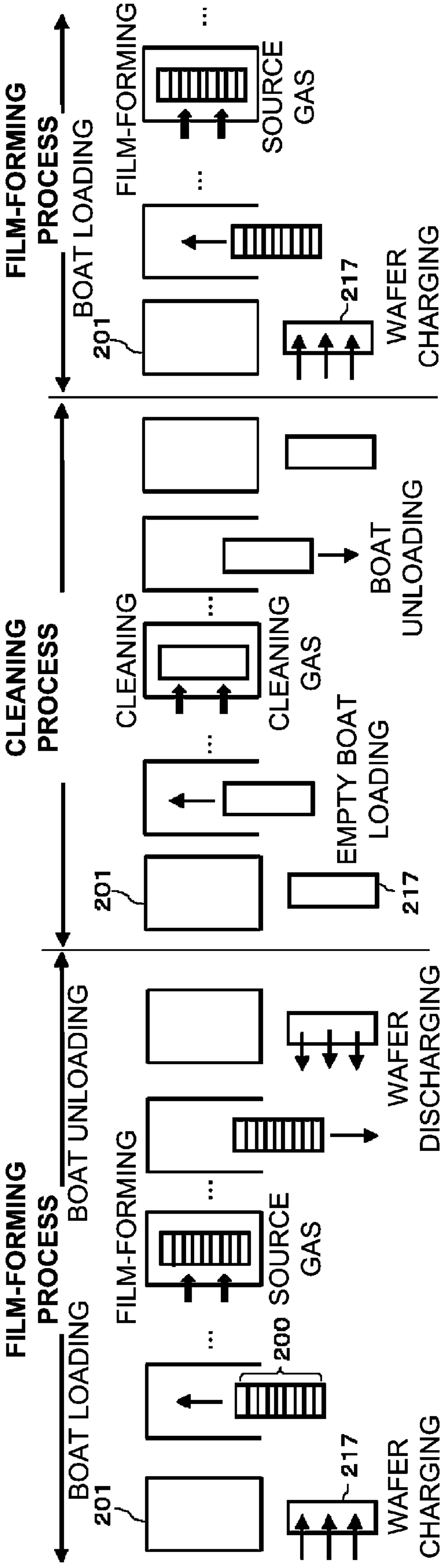
FIG. 4 is a diagram schematically illustrating a processing performed in a process chamber according to the embodiments of the present disclosure.

As shown in FIG. 3, for example, the controller 121 serving as a control device (control structure) is constituted by a computer including a CPU (Central Processing Unit) 121*a*, a RAM (Random Access Memory) 121*b*, a memory 121*c* and an I/O port 121*d*. The RAM 121*b*, the memory 121*c* and the I/O port 121*d* may exchange data with the CPU 121*a* through an internal bus 121*e*. For example, an input/output device 122 constituted by a component such as a touch panel is connected to the controller 121.

For example, the memory 121*c* is configured by a component such as a flash memory and a hard disk drive (HDD). For example, a control program configured to control the operation of the substrate processing apparatus, a process recipe containing information on sequences and conditions of a film-forming process described later, or a cleaning recipe containing information on sequences and conditions of a cleaning process described later may be readably stored in the memory 121*c*. The process recipe is obtained by combining steps (sequences) of the film-forming process described later such that the controller 121 can execute the steps to acquire a predetermined result, and functions as a program. The cleaning recipe is obtained by combining steps (sequences) of the cleaning process described later such that the controller 121 can execute the steps to acquire a predetermined result, and functions as a program. Hereinafter, the process recipe, the cleaning recipe and the control program may be collectively or individually referred to as a "program". In addition, each of the process recipe and the cleaning recipe may also be simply referred to as a "recipe". Thus, in the present specification, the term "program" may refer to the recipe alone, may refer to the control program alone, or may refer to both of the recipe and the control program. The RAM 121*b* functions as a memory area (work area) where a program or data read by the CPU 121*a* is temporarily stored.

The I/O port 121*d* is connected to the above-described components such as the MFCs 241*a* through 241*e*, the valves 243*a* through 243*e*, the pressure sensor 245, the APC valve 244, the vacuum pump 246, the temperature sensor 263, the heater 207, the rotator 267, the boat elevator 115 and the shutter opener/closer 115*s*.

The CPU 121*a* is configured to read the control program from the memory 121*c* and execute the read control program. In addition, the CPU 121*a* is configured to read the recipe from the memory 121*c* in accordance with an operation command inputted from the input/output device 122. According to the contents of the read recipe, the CPU 121*a* may be configured to be capable of controlling various operations such as flow rate adjusting operations for various gases by the MFCs 241*a* through 241*e*, opening and closing operations of the valves 243*a* through 243*e*, an opening and closing operation of the APC valve 244, a pressure adjusting operation by the APC valve 244 based on the pressure sensor 245, a start and stop of the vacuum pump 246, a temperature adjusting operation by the heater 207 based on the temperature sensor 263, an operation of adjusting the rotation and the rotation speed of the boat 217 by the rotator 267, an elevating and lowering operation of the boat 217 by the boat elevator 115 and an opening and closing operation of the shutter 219*s* by the shutter opener/closer 115*s*.

The controller 121 may be embodied by installing the above-described program stored in an external memory 123 into the computer. For example, the external memory 123 may include a magnetic disk such as a hard disk drive (HDD), an optical disk such as a CD, a magneto-optical disk such as an MO and a semiconductor memory such as a USB memory. The memory 121*c* or the external memory 123 may be embodied by a non-transitory computer readable recording medium. Hereafter, the memory 121c and the external memory 123 may be collectively or individually referred to as a "recording medium". In the present specification, the term "recording medium" may refer to the memory 121c alone, may refer to the external memory 123 alone, or may refer to both of the memory 121c and the external memory 123. In addition, instead of the external memory 123, a communication structure such as the Internet and a dedicated line may be used for providing the program to the computer.

(2) Substrate Processing

Hereinafter, an exemplary sequence of a substrate processing of processing the wafer 200 serving as the substrate by supplying the process gas into the process vessel in which the wafer 200 is accommodated will be described. The substrate processing is performed by using the substrate processing apparatus described above. The substrate processing is performed as a part of a manufacturing process of a semiconductor device. In the following descriptions, the operations of the components constituting the substrate processing apparatus are controlled by the controller 121.

In the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer (or a predetermined film) formed on a wafer". Thus, in the present specification, "forming a predetermined layer (or film) on a wafer" may refer to "forming a predetermined layer (or film) on a surface of a wafer itself", or may refer to "forming a predetermined layer (or film) on a surface of another layer (or another film) formed on a wafer". In the present specification, the terms "substrate" and "wafer" may be used as substantially the same meaning.

<Processing of Substrate>

In the present specification, as an example of the substrate processing, the film-forming process of supplying the source gas for a film formation (which serves as the process gas) to the wafer 200 so as to form a film on the wafer 200 will be described.

<Wafer Charging Step and Boat Loading Step>

After the wafers 200 are charged (transferred) into the boat 217 (wafer charging step), the shutter 219s is moved by the shutter opener/closer 115s to open the lower end opening of the manifold 209 (shutter opening step). Then, as shown in FIG. 1, the boat 217 charged with the wafers 200 is elevated by the boat elevator 115 and loaded (transferred) into the process chamber 201 (boat loading step). With the boat 217 loaded, the seal cap 219 seals the lower end of the manifold 209 via the O-ring 220b.

<Pressure Adjusting Step and Temperature Adjusting Step>

After the boat 217 is completely loaded into the process chamber 201, the vacuum pump 246 vacuum-exhausts (decompresses and exhausts) the process chamber 201 (that is, a space in which the wafers 200 are accommodated) such that the inner pressure of the process chamber 201 reaches and is maintained at a desired pressure (vacuum degree). When vacuum-exhausting the process chamber 201, the inner pressure of the process chamber 201 is measured by the pressure sensor 245, and the APC valve 244 is feedback-controlled based on the pressure information measured by the pressure sensor 245 (pressure adjusting step). In addition, the heater 207 heats the process chamber 201 such that a temperature of the wafer 200 accommodated in the process chamber 201 reaches and is maintained at a desired temperature. When heating the process chamber 201, a state of electric conduction to the heater 207 is feedback-controlled based on the temperature information detected by the temperature sensor 263 such that the desired temperature distribution of the temperature of the process chamber 201 is obtained (temperature adjusting step). In addition, the rotator 267 starts rotating the boat 217 and the wafers 200 accommodated in the boat 217. The vacuum pump 246 continuously vacuum-exhausts the process chamber 201, the heater 207 continuously heats the process chamber 201, and the rotator 267 continuously rotates the boat 217 (that is, the wafers 200) until at least a processing of the wafer 200 is completed.

<Film-Forming Step>

After the pressure adjusting step and the temperature adjusting step with respect to the process chamber 201 are completed, the source gas is supplied to the wafers 200 in the process chamber 201.

Specifically, the valve 243a is opened to supply the source gas into the gas supply pipe 232a. A flow rate of the source gas is adjusted by the MFC 241a, and then the source gas whose flow rate is adjusted is supplied into the process chamber 201 through the nozzle 249a, and is exhausted through the exhaust port 231a. Thereby, the source gas is supplied to the wafer 200. In addition, when supplying the source gas, the $N_2$ gas may be supplied into the process chamber 201 through each of the nozzles 249a and 249b by opening the valves 243d and 243e.

For example, process conditions of the present step are as follows:

A supply flow rate of the source gas: from 0.1 slm to 5 slm;

A supply time (time duration) of supplying the source gas: from 1 minute to 180 minutes;

A supply flow rate of the $N_2$ gas (for each gas supply pipe): from 0 slm to 5 slm;

The temperature of the process chamber 201 (which is a film-forming temperature): from 400° C. to 650° C.; and The pressure of the process chamber 201 (which is a film-forming pressure): from 1 Pa to 1,330 Pa.

In the present specification, a notation of a numerical range such as "400° C. to 650° C." means that a lower limit and an upper limit are included in the numerical range. Therefore, for example, the numerical range "400° C. to 650° C." means a range equal to or higher than 400° C. and equal to or lower than 650° C. The same also applies to other numerical ranges described herein.

By supplying the source gas to the wafer 200 under the process conditions described above, it is possible to deposit a predetermined film on a surface of the wafer 200.

For example, a silicon hydride gas such as monosilane ($SiH_4$, abbreviated as MS) gas, disilane ($Si_2H_6$) gas, trisilane ($Si_3H_8$) gas, tetrasilane ($Si_4H_{10}$) gas, pentasilane ($Si_5H_{12}$) gas and hexasilane ($Si_6H_{14}$) gas may be used as the source gas.

Instead of the $N_2$ gas, for example, a rare gas such as argon (Ar) gas, helium (He) gas, neon (Ne) gas and xenon (Xe) gas may be used as the inert gas. The same also applies to the cleaning process described later.

<After-Purge Step and Returning to Atmospheric Pressure Step>

After the predetermined film is formed on the surface of the wafer 200, the valve 243a is closed to stop a supply of the source gas into the process chamber 201. Then, by vacuum-exhausting the process chamber 201, a substance such as a residual gas in the process chamber 201 is removed from the process chamber 201. When vacuum-exhausting the process chamber 201, by opening the valves 243*d* and 243*e*, the $N_2$ gas serving as the purge gas is supplied into the process chamber 201 through each of the nozzles 249*a* and 249*b*, and then is exhausted through the exhaust port 231*a*. Thereby, the process chamber 201 is purged with the $N_2$ gas such that the substance such as the residual gas and reaction by-products remaining in the process chamber 201 is removed from the process chamber 201 (after-purge step). Thereafter, the inner atmosphere of the process chamber 201 is replaced with the inert gas (inert gas substitution step), and the inner pressure of the process chamber 201 is returned to the atmospheric pressure (returning to atmospheric pressure step).

<Boat Unloading Step and Wafer Discharging Step>

Thereafter, the seal cap 219 is lowered by the boat elevator 115 and the lower end of the manifold 209 is opened. Then, the boat 217 with the processed wafers 200 supported therein is unloaded (transferred) out of the reaction tube 203 through the lower end of the manifold 209 (boat unloading step). After the boat 217 is unloaded, the shutter 219*s* is moved such that the lower end opening of the manifold 209 is sealed by the shutter 219*s* through the O-ring 220*c* (shutter closing step). The processed wafers 200 are discharged (transferred) from the boat 217 after the boat 217 is unloaded out of the reaction tube 203 (wafer discharging step).

(3) Cleaning Process

When the film-forming process described above is performed, deposits containing the film are accumulated on an inner structure of the process vessel (that is, an inner structure provided in the process chamber 201), for example, on the inner wall of the reaction tube 203, surfaces of the nozzles 249*a* and 249*b*, a surface of the boat 217 and the like. That is, the deposits containing the film may adhere to a surface of the inner structure provided in the process chamber 201 heated to the film-forming temperature. According to the present embodiments, the cleaning process of removing the deposits is performed when an amount of the deposits accumulated in the process vessel (that is, an accumulated thickness of the film on the inner structure) reaches a predetermined amount (thickness) before the deposits are peeled off or fall off.

In the cleaning process, the cleaning gas is supplied into the process vessel to remove the deposits adhering to the inner structure in the process vessel. In addition, the step of removing the deposits may be performed as a part of the manufacturing process of the semiconductor device described above, and in the following descriptions, the operations of the components constituting the substrate processing apparatus are controlled by the controller 121.

<Empty Boat Loading Step>

The shutter 219*s* is moved by the shutter opener/closer 115*s* to open the lower end opening of the manifold 209 (shutter opening step). Then, the boat 217 which is empty (that is, the boat 217 in which the wafers 200 are not accommodated) is elevated by the boat elevator 115 and loaded (transferred) into the process chamber 201 (empty boat loading step). With the boat 217 loaded, the seal cap 219 seals the lower end of the manifold 209 via the O-ring 220*b*.

<Pressure Adjusting Step and Temperature Adjusting Step>

After the boat 217 is completely loaded into the process chamber 201, the vacuum pump 246 vacuum-exhausts the process chamber 201 such that the inner pressure of the process chamber 201 reaches and is maintained at a desired pressure (pressure adjusting step). In addition, the heater 207 heats the process chamber 201 such that the temperature of the process chamber 201 reaches and is maintained at a desired temperature (which is a first temperature) (temperature adjusting step). When heating the process chamber 201, the inner structure of the process chamber 201 (that is, the inner wall of the reaction tube 203, the surfaces of the nozzles 249*a* and 249*b*, the surface of the boat 217 and the like) is also heated to the first temperature. In addition, the rotator 267 starts rotating the boat 217 and the wafers 200 accommodated in the boat 217. The vacuum pump 246 continuously vacuum-exhausts the process chamber 201, the heater 207 continuously heats the process chamber 201, and the rotator 267 continuously rotates the boat 217 until at least a cleaning step described later is completed. Alternatively, the boat 217 may not be rotated.

<Cleaning Step>

After the pressure adjusting step and the temperature adjusting step with respect to the process chamber 201 are completed, the cleaning gas is supplied to the heated process chamber 201 in which the wafers 200 are not accommodated. Specifically, the valve 243*b* is opened to supply the cleaning gas into the gas supply pipe 232*b*. A flow rate of the cleaning gas is adjusted by the MFC 241*b*, and then the cleaning gas whose flow rate is adjusted is supplied into the process chamber 201 through the gas supply pipe 232*b* and the nozzle 249*b*, and is exhausted through the exhaust port 231*a*. In addition, when supplying the cleaning gas, the $N_2$ gas may be supplied into the process chamber 201 through each of the nozzles 249*a* and 249*b* by opening the valves 243*d* and 243*e*.

For example, process conditions of the present step are as follows:

A supply flow rate of the cleaning gas: from 0.1 slm to 5 slm;

A supply flow rate of the $N_2$ gas (for each gas supply pipe): from 0 slm to 50 slm;

A supply time (time duration) for each gas: from 0.5 minute to 60 minutes, preferably from 5 minutes to 20 minutes;

A process temperature (which is a chamber cleaning temperature): from 100° C. to 600° C., preferably from 350° C. to 450° C.; and A process pressure (which is a chamber cleaning pressure): from 1 Pa to 30,000 Pa, preferably from 1,000 Pa to 5,000 Pa.

By supplying the cleaning gas to the process chamber 201 under the process conditions described above, for example, it is possible to generate the active species such as radicals in the process chamber 201. The cleaning gas comes into contact with the inner structure of the process chamber 201 (for example, the inner wall of the reaction tube 203, the surfaces of the nozzles 249*a* and 249*b*, the surface of the boat 217 and the like). Thereby, it is possible to remove the deposits on the surface of the inner structure of the process chamber 201 by a thermochemical reaction (etching reaction).

<After-Purge Step and Returning to Atmospheric Pressure Step>

After a predetermined time has elapsed and the cleaning step with respect to the process chamber 201 is completed, the valve 243*b* is closed to stop a supply of the cleaning gas to the process chamber 201. Then, the process chamber 201 is purged (after-purge step) in the same manners as in the after-purge step of the film-forming process. In the after-purge step, the process chamber 201 may be purged intermittently by repeatedly performing an opening and closing operation of the valve 243*b* (that is, a cyclic purge may be performed). Thereafter, the inner atmosphere of the process chamber 201 is replaced with the $N_2$ gas (inert gas substitution step), and the inner pressure of the process chamber 201 is returned to the atmospheric pressure (returning to atmospheric pressure step).

<Boat Unloading Step>

Thereafter, the seal cap 219 is lowered by the boat elevator 115 and the lower end of the manifold 209 is opened. Then, the empty boat 217 is unloaded (transferred) out of the reaction tube 203 through the lower end of the manifold 209 (boat unloading step). After the boat 217 is unloaded, the shutter 219*s* is moved such that the lower end opening of the manifold 209 is sealed by the shutter 219*s* through the O-ring 220*c*. When the steps of the cleaning process described above are completed, the film-forming process described above may be resumed (see FIG. 4).

(4) Start Timing of Cleaning Process

A timing at which the cleaning process is started according to the present embodiments will be described below in comparison with a comparative example.

Figure 5A:
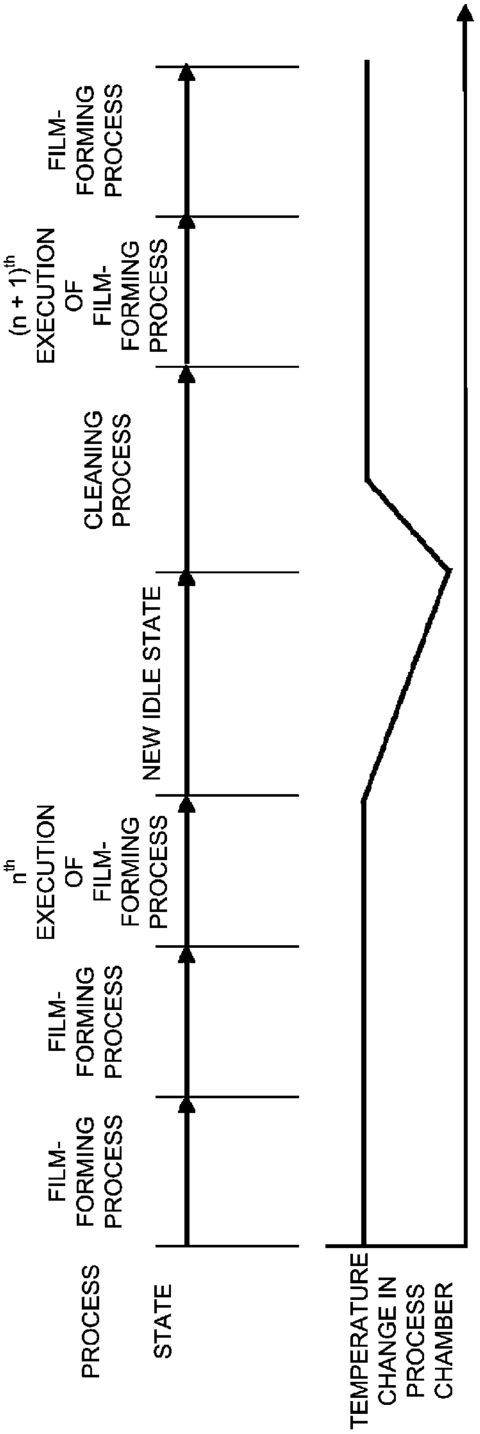
FIG. 5A is a diagram schematically illustrating a temperature change in the process chamber according to the embodiments of the present disclosure.
Figure 5B:
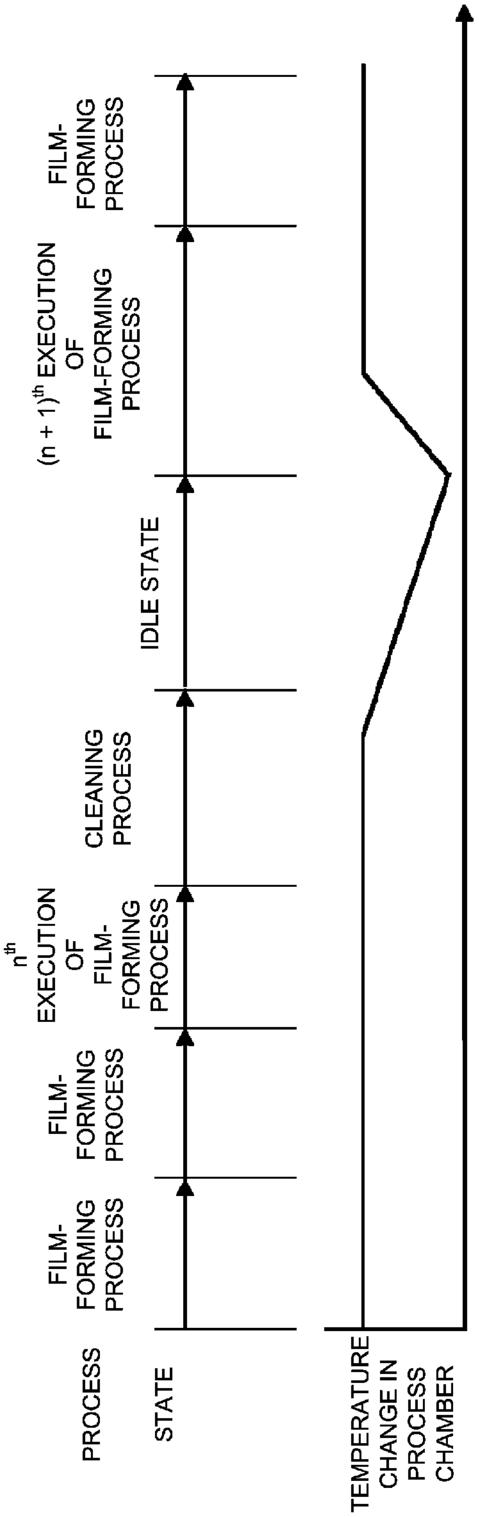
FIG. 5B is a diagram schematically illustrating a temperature change in the process chamber according to a comparative example.

The comparative example shown in FIG. 5B is provided as an operation example of a conventional substrate processing apparatus. According to the comparative example shown in FIG. 5B, when the accumulated thickness of the film in the process furnace 202 reaches a predetermined thickness during an $n^{th}$ execution of the film-forming process (n is an integer of 1 or more), which means a state indicating that the cleaning process should be performed has been reached, the cleaning process is automatically started immediately after the $n^{th}$ execution of the film-forming process is completed.

As shown in the comparative example of FIG. 5B, when the cleaning process is performed at a timing immediately after the film-forming process, a large temperature divergence is observed between an $(n+1)^{th}$ execution of the film-forming process started after the cleaning process shown in FIG. 5B and the $(n+1)^{th}$ execution of the film-forming process without performing the cleaning process. In particular, it is considered that a difference in the temperature at a start of the film-forming process causes a difference in a temperature history during the film-forming process and causes a difference in a quality of the film-forming process between a plurality of executions of the film-forming process.

When the $n^{th}$ execution of the film-forming process is completed and a situation indicating that the $(n+1)^{th}$ execution of the film-forming process should be started has not been reached, a state of the substrate processing apparatus is transitioned (changed) to an "idle state" in which the substrate processing apparatus waits until the situation indicating that the $(n+1)^{th}$ execution of the film-forming process should be started is reached. In the idle state, it is desirable that the heater 207 is not in operation (that is, a heater output is zero) or that the heater output is not slightly but significantly reduced for the reason of reducing an operation cost and a maintenance cost. Therefore, the substrate processing apparatus may be configured to control the heater 207 as described above.

Depending on an implement schedule of the film-forming process (or a production schedule of the semiconductor device), the idle state may continue for a long time. Therefore, when the $(n+1)^{th}$ execution of the film-forming process is started after the idle state continues for a long time, the temperature of the process chamber may significantly lowered as compared with a case where the film-forming process is continuously performed without going through the idle state for a long time. Thus, it takes a long time to elevate the temperature of the process chamber 201, which has been greatly lowered as described above, to a temperature suitable for the film-forming process, as compared with the case where the film-forming process is continuously performed without going through the idle state.

Therefore, when an $(n+1)^{th}$ execution of the substrate processing (that is, the film-forming process) is started after the idle state continues for a long time after the cleaning process is performed, a thermal history of the wafer 200 tends to be greater than the thermal history of the wafer 200 in a case where the film-forming process is continuously performed without going through the idle state, that is, where the cleaning process is not performed.

In order to address the problems described above, according to the present embodiments shown in FIG. 5A, when the accumulated thickness of the film reaches the predetermined thickness during an $n^{th}$ execution of the substrate processing (that is, the film-forming process) (that is, the state indicating that the cleaning process should be performed has been reached), the cleaning process is performed not immediately after the $n^{th}$ execution of the film-forming process but immediately before a start of the $(n+1)^{th}$ execution of the film-forming process. In FIG. 5A, the temperature at which the cleaning process is performed and the temperature at which the film-forming process is performed are the same. However, it is just an example showing that the temperature at the start of the film-forming process is stabilized at the same temperature. That is, the temperature at which the cleaning process is performed and the temperature at which the film-forming process is performed may not be the same. It is desirable to maintain an inner temperature of the process furnace 202 constant at the start of the film-forming process.

Specifically, in the substrate processing apparatus according to the present embodiments, when the situation indicating that the $(n+1)^{th}$ execution of the film-forming process should be started has not been reached after the film-forming process is performed n times, that is, when an execution command of the $(n+1)^{th}$ execution of the film-forming process has not been received yet, without starting the cleaning process, the state of the substrate processing apparatus is transitioned to a "new idle state" in which the substrate processing apparatus waits until the situation indicating that the $(n+1)^{th}$ execution of the film-forming process should be started is reached.

It can be said that the idle state (that is, the new idle state described above) according to the present embodiments is completely different from the idle state of the comparative example shown in FIG. 5B in that the cleaning process is not started even though the state indicating that the cleaning process should be performed has been reached. That is, according to the present embodiments, even though there is a process to be performed, the process is not started and the substrate processing apparatus waits until a start command (that is, the execution command described above) of the $(n+1)^{th}$ execution of the film-forming process is received while the heater 207 is not in operation or the heater output is reduced.

Further, in the idle state according to the present embodiments, when the start command of the (n+1)$^{th}$ execution of the film-forming process is received, rather than immediately starting the film-forming process corresponding to the start command, the cleaning process is performed before performing the film-forming process corresponding to the start command. Therefore, according to the comparative example shown in FIG. 5B, it is considered that the temperature at the start of the film-forming process is completely different depending on a time duration of the idle state (or a time duration between adjacent executions of the film-forming process). However, according to the present embodiments shown in FIG. 5A, the temperature at the start of the film-forming process can be stabilized regardless of the time duration of the idle state (that is, the new idle state described above). Further, the situation indicating that the film-forming process should be started is described above as a timing at which the execution command of the film-forming process is received. However, the situation indicating that the film-forming process should be started may refer to a timing at which an entirety of substrates to be processed next are transferred (loaded) into the substrate processing apparatus.

According to the present embodiments, a period T2 from a completion of the cleaning process to the start of the (n+1)$^{th}$ execution of the film-forming process is controlled to be shorter than a period T1 from a completion of the n$^{th}$ execution of the film-forming process to a start of the cleaning process. For example, the period T2 may be set to be zero. Thereby, it is possible to efficiently utilize the heat during the cleaning process at the start of the (n+1)$^{th}$ execution of the film-forming process. Thereby, it is possible to match the thermal history of the wafer 200 in the (n+1)$^{th}$ execution of the film-forming process with the thermal history of the wafer 200 in the film forming process continuously performed. As a result, it is possible to stabilize the process conditions (for example, the temperature) at the start of the film-forming process regardless of a waiting time between the adjacent executions of the film-forming process, and thereby, it is possible to uniformize a processing quality of the wafer 200. In such a case, as long as the processing of the wafer 200 is not affected, the process conditions do not have to be exactly matched, and an error within a certain predetermined range may be permitted.

When the state is transitioned to the new idle state, it is preferable that an operation of limiting a manipulation of the cleaning process is autonomously and automatically controlled by the controller 121 rather than by an operating personnel until the execution command of the (n+1)$^{th}$ execution of the film-forming process is received. In such a case, even when a start command of the cleaning process is input to the substrate processing apparatus by the operating personnel's manipulation, an interlock is automatically activated until the execution command of the (n+1)$^{th}$ execution of the film-forming process is received so as to restrict the start of the cleaning process.

As described above, according to the present embodiments, even when the state indicating that the cleaning process should be performed has been reached during an n$^{th}$ execution of the substrate processing (that is, the n$^{th}$ execution of the film-forming process), the cleaning process is not automatically started after the n$^{th}$ execution of the substrate processing is completed. Rather, after the n$^{th}$ execution of the substrate processing is completed, the cleaning process waits until an instruction of an (n+1)$^{th}$ execution of the substrate processing (that is, the execution command of the (n+1)$^{th}$ execution of the film-forming process) is received. Then, the cleaning process is started after the instruction is received. Further, after the cleaning process is completed, since the instruction of the (n+1)$^{th}$ execution of the substrate processing is already received, the (n+1)$^{th}$ execution of the substrate processing can be started immediately. As described above, by performing the cleaning process immediately before the (n+1)$^{th}$ execution of the substrate processing, it is possible to suppress a decrease in the temperature of the process chamber 201 at a start of the substrate processing.

(5) Effects According to Present Embodiments

According to the present embodiments, it is possible to provide one or more of the following effects.

(a) Since the cleaning process is performed before the start of the (n+1)$^{th}$ execution of the film-forming process, it is possible to efficiently utilize the heat during the cleaning process at the start of the (n+1)$^{th}$ execution of the film-forming process. Thereby, it is possible to match the thermal history of the wafer 200 in the (n+1)$^{th}$ execution of the film-forming process with the thermal history of the wafer 200 in the other executions (that is, a first execution through the n$^{th}$ execution) of the film-forming process. As a result, it is possible to uniformize the processing quality between the plurality of executions of the film-forming process.

(b) Since the cleaning process is performed before the start of the (n+1)$^{th}$ execution of the film-forming process, it is possible to efficiently utilize the heat during the cleaning process regardless of a time until the start of the (n+1)$^{th}$ execution of the film-forming process. Thereby, it is possible to match the process conditions at the start of the film-forming process regardless of a length of the waiting time. As a result, it is possible to uniformize the processing quality between the plurality of executions of the film-forming process.

(c) Since the operation of limiting the manipulation of the cleaning process described above is autonomously and automatically controlled by the controller 121, it is possible to prevent the cleaning process from being started at an erroneous timing by the operating personnel's manipulation, and thereby it is possible to uniformize the processing quality between the plurality of executions of the film-forming process.

(d) According to the present embodiments, since the cleaning process is performed before the start of the (n+1)$^{th}$ execution of the film-forming process it is possible to, by not operating the heater 207 or reducing the heater output in the new idle state, reduce the power consumption such that the process furnace 202 lasts longer, and it is also possible to uniformize the processing quality between the plurality of executions of the film-forming process.

Other Embodiments

While the technique of the present disclosure is described in detail by way of the embodiments described above, the technique of the present disclosure is not limited thereto. The technique of the present disclosure may be modified in various ways without departing from the scope thereof.

For example, the technique of the present disclosure may also be preferably applied when, as the predetermined film formed on the wafer 200, a silicon-based film such as a silicon film (Si film), a silicon oxide film (SiO film), a silicon nitride film (SiN film) and a silicon carbide film (SiC film) is formed on the wafer 200. In addition, the technique of the present disclosure may also be preferably applied when a titanium nitride film (TiN film) is formed on the wafer 200. In addition, the technique of the present disclosure may also be preferably applied when a high dielectric constant insulating film (also referred to as a "High-k film") such as an aluminum oxide film (AlO film) is formed on the wafer 200.

Further, as the cleaning gas, a fluorine-based gas such as fluorine ($F_2$) gas, hydrogen fluoride (HF) gas and nitrogen trifluoride ($NF_3$) or a mixed gas thereof may also be preferably used. In addition, a chlorine-based gas such as hydrogen chloride (HCl) may also be preferably used as the cleaning gas.

For example, recipes used in the processes of the embodiments described above may be preferably prepared individually according to the process contents and may be preferably stored in the memory 121*c* via an electric communication line or the external memory 123. Then, when starting each process, preferably, the CPU 121*a* is configured to select an appropriate recipe among the recipes stored in the memory 121*c* according to the process contents. Thereby, various films of different types, different composition ratios, qualities and thicknesses may be formed in a reproducible manner by using a single substrate processing apparatus. In addition, since the burden on the operating personnel of the substrate processing apparatus can be reduced, various processes may be started (performed) quickly while avoiding a malfunction of the substrate processing apparatus.

Further, it is preferable to associate the process recipe and the cleaning recipe in advance and store them in the memory 121*c* so that the cleaning gas can be appropriately selected according to a type of the film. Further, according to the present embodiments, it is preferable to fix an execution time of the cleaning recipe. For example, it is preferable to maintain a cleaning process time (which is a supply time of the cleaning gas) constant. As a result, since the cleaning recipe is executed immediately before the process recipe, it is possible to stabilize a state in the process furnace 202 at a start of the process recipe.

The recipe described above is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. Further, the existing recipe already stored in the substrate processing apparatus may be directly changed to the new recipe by operating the input/output device 122 of the substrate processing apparatus.

While the above-described embodiments are described by way of an example in which whether or not the state indicating that the cleaning process should be performed has been reached is determined based on whether or not the accumulated thickness of the film in the process furnace 202 has reached the predetermined thickness, the technique of the present disclosure is not limited thereto. For example, whether or not the state indicating that the cleaning process should be performed has been reached may be determined based on whether or not the film-forming process has been performed a predetermined number of times. Further, instead of the examples described above, whether or not the state indicating that the cleaning process should be performed has been reached may be determined based on the presence or absence of the operating personnel's instruction. Further, whether or not the state indicating that the cleaning process should be performed has been reached may be determined based on the number of times or the usage time of the structure to be cleaned. As described above, it is possible to appropriately set determination criteria (determination requirements) as to whether or not the state indicating that the cleaning process should be performed has been reached.

The substrate processing apparatus according to the embodiments described above is configured to perform the film-forming process. For example, the film-forming process may be a CVD process, a PVD process, a process of forming an oxide film, a process of forming a nitride film, or a process of forming a film containing a metal. Further, the specific content of the substrate processing is not limited. For example, in addition to or instead of the film-forming process, a process such as an annealing process, an oxidation process, a nitridation process and a diffusion process may be performed as the substrate processing. In addition, the technique of the present disclosure may also be applied to other substrate processing apparatuses such as an exposure apparatus, a lithography apparatus, a coating apparatus and a CVD apparatus using the plasma. Further, although a semiconductor manufacturing apparatus is described as an example of the substrate processing apparatus, the technique of the present disclosure is not limited to the semiconductor manufacturing apparatus, and may also be applied to a glass substrate processing apparatus such as an LCD apparatus.

For example, the above-described embodiments are described by way of an example in which a batch type substrate processing apparatus configured to simultaneously process a plurality of substrates is used to form the film. However, the technique of the present disclosure is not limited thereto. For example, the technique of the present disclosure may be preferably applied when a single wafer type substrate processing apparatus configured to process one or several substrates at a time is used to form the film. For example, the above-described embodiments are described by way of an example in which a substrate processing apparatus including a hot wall type process furnace is used to form the film. However, the technique of the present disclosure is not limited thereto. For example, the technique of the present disclosure may be preferably applied when a substrate processing apparatus including a cold wall type process furnace is used to form the film.

The process sequences and the process conditions of each process using the substrate processing apparatuses described above may be substantially the same as those of the embodiments described above. Even in such a case, the same effects according to the embodiments described above may also be obtained similarly.

The embodiments described above and modified examples described above may be appropriately combined. In addition, the process sequences and the process conditions of each combination thereof may be substantially the same as those of the embodiments described above.

According to some embodiments of the present disclosure, it is possible to uniformize the quality of the substrate processing between the plurality of executions of the substrate processing.

What is claimed is:

1. A method of manufacturing a semiconductor device, comprising:

(a) processing a substrate accommodated in a process chamber by supplying a process gas to the substrate;

(b) removing deposits adhering to a structure in the process chamber by supplying a cleaning gas to the process chamber, wherein, when a state indicating that (b) is to be performed is reached, (b) is started immediately before an $(n+1)^{th}$ execution of (a) is started such that a period T2 from a completion of (b) to a start of the $(n+1)^{th}$ execution of (a) is shorter than a period T1 from a completion of an $n^{th}$ execution of (a) to a start of (b), and wherein n is an integer equal to or greater than 1.

2. The method of claim 1, wherein, when a state indicating that (b) should be performed has been reached, (b) is started at a timing at which a situation indicating that the $(n+1)^{th}$ execution of (a) should be started has been reached instead of at a timing immediately after a completion of (a) continuously performed n times without performing (b).

3. The method of claim 2, further comprising (c) when (a) is continuously performed n times and the situation indicating that the $(n+1)^{th}$ execution of (a) should be started has not been reached, transitioning to an idle state waiting for the situation indicating that the $(n+1)^{th}$ execution of (a) should be started without performing the start of (b).

4. The method of claim 3, wherein, when the situation indicating that the $(n+1)^{th}$ execution of (a) should be started has been reached during the idle state, the $(n+1)^{th}$ execution of (a) is performed after (b) is performed.

5. The method of claim 1, wherein (b) is performed immediately before the start of the $(n+1)^{th}$ execution of (a).

6. The method of claim 1, wherein the period T2 from the completion of (b) to the start of the $(n+1)^{th}$ execution of (a) is set to be zero.

7. The method of claim 1, wherein process conditions of (b) are maintained constant.

8. The method of claim 1, wherein a temperature of the process chamber among process conditions of (b) is maintained within a predetermined range.

9. The method of claim 1, wherein an execution time of (b) is maintained constant.

10. The method of claim 1, wherein a supply time of the cleaning gas in (b) is maintained constant.

11. The method of claim 1, wherein the process gas comprises a silicon hydride gas selected from the group consisting of monosilane ($SiH_4$) gas, disilane ($Si_2H_6$) gas, trisilane ($Si_3H_8$) gas, tetrasilane ($Si_4H_{10}$) gas, pentasilane ($Si_5H_{12}$) gas and hexasilane ($Si_6H_{14}$) gas.

12. The method of claim 1, wherein the cleaning gas comprises a fluorine-based gas selected from the group consisting of fluorine ($F_2$) gas, hydrogen fluoride (HF) gas and nitrogen trifluoride ($NF_3$) or a mixed gas thereof.

13. The method of claim 1, wherein a film is formed in (a), and wherein the film is selected from the group consisting of a silicon-based film comprising a silicon film (Si film), a silicon oxide film (SiO film), a silicon nitride film (SiN film) and a silicon carbide film (SiC film), a metal film comprising a titanium nitride film (TiN film) and a high dielectric constant insulating film (High-k film) comprising an aluminum oxide film (AlO film).

* * * * *